United States Patent [19]

Gotou et al.

[11] Patent Number: 4,728,797
[45] Date of Patent: Mar. 1, 1988

[54] METHOD FOR DRAWING A PATTERN BY CHARGED BEAM AND ITS APPARATUS

[75] Inventors: Mineo Gotou, Kawasaki; Hideo Kusakabe, Chiba, both of Japan

[73] Assignee: Kabushiki Kaisha Toshiba, Kawasaki, Japan

[21] Appl. No.: 943,739

[22] Filed: Dec. 19, 1986

[30] Foreign Application Priority Data

Dec. 24, 1985 [JP] Japan .................................. 60-291324

[51] Int. Cl.⁴ ..................... H01J 37/304; H01J 37/302
[52] U.S. Cl. .................................. 250/492.2; 364/490
[58] Field of Search ..................... 250/492.22; 364/490, 364/518

[56] References Cited

U.S. PATENT DOCUMENTS 4,586,141  4/1986  Yasuda et al. .................. 250/492.22

OTHER PUBLICATIONS

Weber et al., J. Vac. Sci. Technol., 16(6), Nov./Dec., 1979, pp. 1780–1782.
J. Vac. Sci. Technol., B3(1)1–476, Jan./Feb. 1985, pp. 106–111, H. J. King et al.

Primary Examiner—Craig E. Church
Assistant Examiner—Jack I. Berman
Attorney, Agent, or Firm—Oblon, Fisher, Spivak, McClelland & Maier

[57] ABSTRACT

The data in a counter in which a tolerable displacement of a table during the drawing in a sub-field and a movement of the table are compared in comparator. When the table movement exceeds a predetermined tolerable displacement preset in circuit for table movement correction, a signal for interrupting the pattern drawing is transferred to a control section. The main deflection position and the correction data for minor deflection distortion are set anew by a computer. Then, drawing of the remaining patterns is restarted.

6 Claims, 8 Drawing Figures

METHOD FOR DRAWING A PATTERN BY CHARGED BEAM AND ITS APPARATUS

BACKGROUND OF THE INVENTION

This invention relates to a method for drawing a pattern by deflecting a charged beam within a chip pattern drawing field in major and minor deflection modes, and its apparatus.

To increase the throughput of charged beam drawing, there is known a method in which drawing is performed on a wafer put on a table while the table is continuously moving. In this case, it is necessary to perform correction of the deflection position in accordance with the movement of the table. The term "deflection position" will be used to mean a position of a chip area hit by the deflected beam. This correction is performed during drawing by the minor deflector, by supplying the real position data of the table to the major deflection coil via the table error DAC (digital/analog converter). The system based on the above method is disclosed, for example, in "An electron beam lithography system for submicron VHSIC device fabrication" in J. Vac. Sci. Technol. B3(1), Jan./Feb., 1985, pp. 106 to 111, by H. J. King, et al.

Now, the moving speed of the table is set to a fixed value inherent to a given frame, regardless of the density of the pattern being drawn. Therefore, for example, in a case where the pattern of one sub-field is dense and takes a long time to draw, an amount of movement of the table increases, and an amount of correction of the major deflection position increases accordingly. In accordance with this, it becomes necessary to re-adjust the initially set deflection distortion correction. However, this adjustment of the deflection distortion correction cannot be done until the drawing of the subfield by the minor deflector is finished. For this reason, when an amount of correction of the major deflection position due to the table movement is large, reduction of the accuracy of drawing in the sub-field is problematic because the deflection distortion correction cannot be adjusted. Especially for submicron order pattern drawing, serious problems such as reduction of the production yield due to the deterioration of the accuracy of drawing position arise.

SUMMARY OF THE INVENTION

An object of this invention is to provide a method for drawing a pattern by the charged beam by means of major and minor deflectors in which when, by using major and minor deflectors, a pattern is being drawn on a wafer placed on a continuously moving table, if the major deflection position is greatly corrected with the movement of the table, the deflection distortion correction can be readjusted, while keeping a high drawing throughput and high drawing accuracy.

Another object of this invention is to provide an apparatus for executing the above method.

According to a feature of the present invention, when a pattern is being drawn on a semiconductor chip placed on a continuously moving table by means of major and minor deflectors, during the pattern drawing on a sub-field, a correction amount of the major deflection is detected when the table is moved. When the moved amount exceeds a predetermined value, the sub-field drawing is interrupted. The distortion correction due to the minor deflection is recorrected. Then, the charged beam drawing is applied to the remaining portion of the sub-field.

According to one aspect of this invention, there is provided a charged beam drawing method for drawing a desired pattern on a specimen, such as a wafer placed on a continuously moving table, by using a major deflector with a large beam deflection width and a minor deflector with a small beam deflection width, the charged beam drawing method comprising the steps of: segmenting an area to be drawn into small areas such as sub-fields within which the charged beam is deflectable by the minor deflector; setting a major deflection position as given by the major deflector at a designated small area; setting the correction data for minor deflection distortion in connection with the major deflection position; drawing a pattern within the small area while correcting a minor deflection distortion on the basis of the correction data; feeding back to the major deflector the position data of the table when patterns are successively drawn in the small areas, thereby to correct an incorrect displacement of the drawing position due to the movement of the table; interrupting the small area drawing by the minor deflection when the table moves from the position of the table when the small area drawing starts, by a distance longer than a predetermined distance; resetting the major deflection position at a position allowing the drawing of the remaining pattern in the small area; resetting the minor deflection correction data in connection with the major deflection position after the major deflection position resetting; and drawing the remaining patterns in the small area.

According to another aspect of this invention, there is provided a charged beam drawing apparatus having a major deflector with a large deflection width and a minor deflector for drawing a pattern in small areas, the charged beam drawing apparatus comprising: a table on which a specimen to be drawn by generated charged beam is placed; means for moving the table; means for detecting a moved distance of the table; means for correcting a deviation of the major deflection beam position caused by the movement of the table; means for setting a tolerable movement of the table during a sub-field drawing; means for drawing a predetermined pattern by using the charged beam; means for interrupting the drawing when the table movement exceeds a set value; means for resetting the major deflection position to a position allowing the drawing of the remaining pattern of the sub-field; means for resetting correction data for the minor deflection distortion in connection with the reset position; and means for drawing the remaining patterns after these settings are done.

With such an arrangement, when patterns are drawn in small areas within which the minor deflector can deflect the charged beam, before a distortion, due to an incorrect displacement of the major deflection position which is caused when the movement of the table, is corrected, it is possible to reset the major deflection position and the minor deflection distortion correction data. Therefore, the deflection distortion can reliably be corrected, and patterns can be drawn on a semiconductor chip with a high accuracy.

DETAILED DESCRIPTION OF THE PREFERRED EMBODIMENTS

An embodiment of this invention will be described with reference to the accompanying drawings. In this embodiment, an electron beam is used as a charged beam, but an ion beam can also be used.

Figure 1:
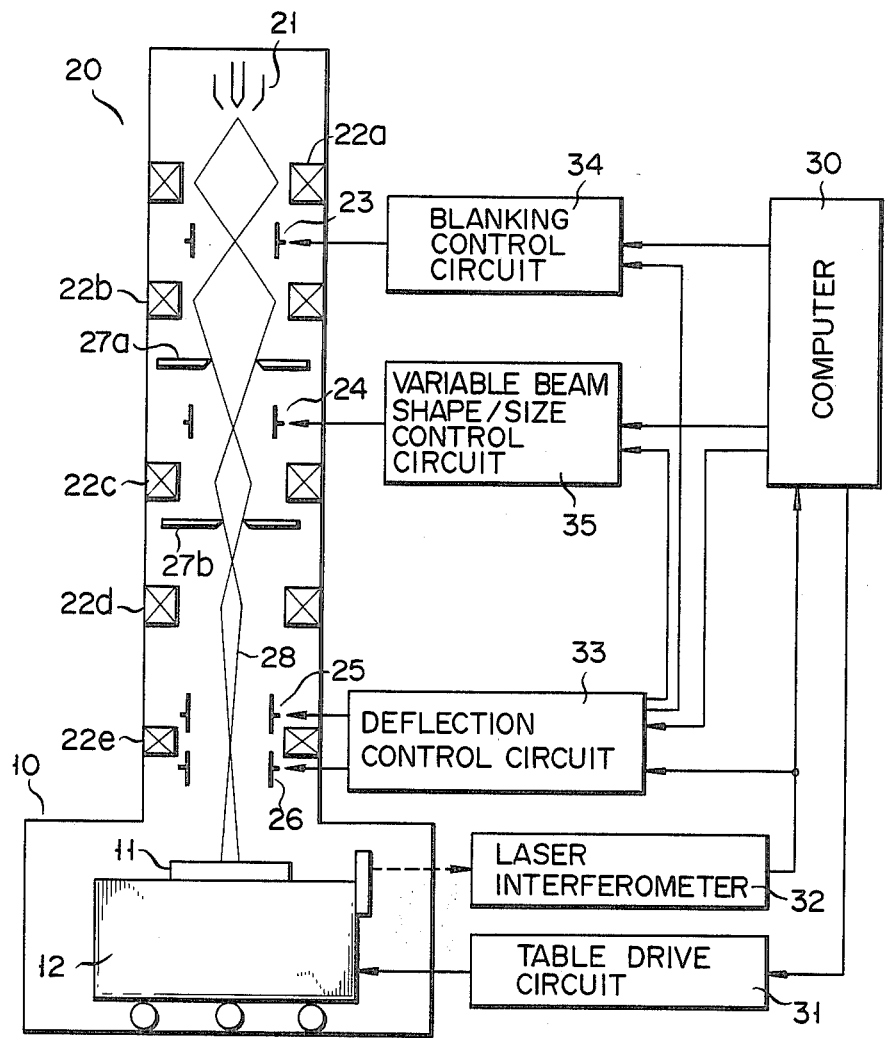
FIG. 1 shows a block diagram illustrating an overall arrangement of an embodiment of this invention.

FIG. 1 shows a block diagram of the configuration of an electron beam pattern drawing device. In the figure, table 12, with a semiconductor wafer 11 placed on top, is housed in table chamber 10.

Electro-optical tube 20, having an aperture opened to table 12, is located in the upper section of table chamber 10. The following items are located inside electro-optical tube 20: electron gun 21, first illumination lens 22a, second illumination lens 22b, field lens 22c, demagnification lens 22d, objective lens 22e, blanker 23, electrostatic shaper 24, major deflector 25, minor deflector 26, upper shaper 27a, and lower shaper 27b. Blanker 23 is used to turn on and off electron beam 28, emitted from electron gun 21. Upper and lower shapers 27a and 27b are beam shaping aperture masks used to change the shape and size of the beam 28 by adjusting the overlapping of the two apertures formed in shapers 27a and 27b.

Major deflector 25 is used to produce wide deflection for locating beam 28 in a selected sub-field of wafer 11. Minor deflector 26 is used to deflect the beam within the selected sub-field according to the pattern to be drawn.

Drive circuit 31, which is controlled by computer 30, moves table 12 in an X-direction (left and right on the paper) or a Y-direction (to the front and back of the paper). The distance of this movement is measured by laser interferometer 32. Then the information of the table movement is sent to deflection control circuit 33, to be described later. Deflection control circuit 33 is supplied with pattern data from computer 30. In accordance with this information, a signal which causes beam 28 to be deflected is supplied to major deflector 25 and minor deflector 26 from deflector control circuit 33.

Pattern data is also supplied from computer 30 to blanking control circuit 34 and variable beam shape/size control circuit 35. Blanking control circuit 34 forms a blanking signal for turning beam 28 on and off according to pattern data from computer 30. This blanking signal is sent to blanker 23. Beam shape/size control circuit 35 generates a voltage signal, in accordance with the pattern data, by which a beam, whose shape and size match that of every part of the pattern, is formed. This signal is sent to electrostatic beam shaper 24.

Figure 2:
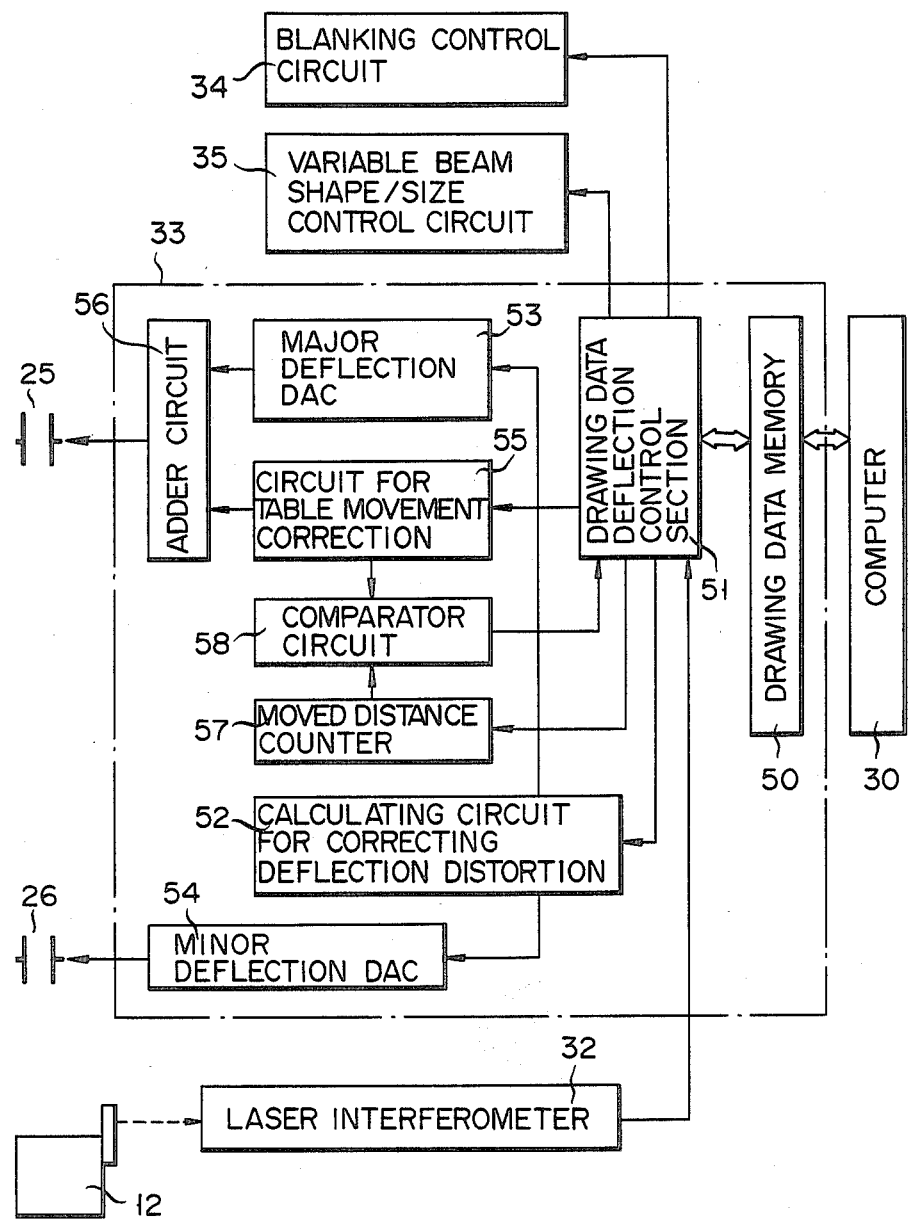
FIG. 2 shows a block diagram showing in detail a major portion of the arrangement of FIG. 1.

In deflection control circuit 33, as shown in FIG. 2, pattern drawing data from computer 30 is temporarily stored in buffer memory 50. Then it is sent to drawing data deflection control section 51. Drawing data deflection control section 51 includes a pattern generator, and it is for controlling the deflection control synchronization and drawing data in deflection control circuit 33. Specifically, beam on/off data and the deflection data which accord to the pattern to be drawn are respectively transferred to blanking control circuit 34 and variable beam shape/size control circuit 35. Position data of table 12 obtained by laser interferometer 32 is sent via drawing data deflection control section 51 to computer 30.

Major deflection position data and minor deflection distortion correction coefficient data, which are calculated by computer 30 based on drawing data and table position data, are sent from drawing data deflection control section 51 to calculating circuit 52 for correcting deflection distortion. Calculating circuit 52 calculates the major deflection position after the major deflection distortion correction was made, based on the drawing data and table position data, which are applied from computer 30. This main deflection data, after distortion correction, is sent to the main deflection DAC (digital/analog converter).

Also in the calculating circuit 52 for correcting deflection distortion, a formula for calculating minor deflection distortion correction, which is expressed by a higher order polynomial (described later), is calculated by using the minor deflection distortion correction coefficient data coming from computer 30. By this calculation, distortion-corrected minor deflection position data is obtained. This data is applied to minor deflection DAC 54. The major deflection position data is kept stored in major deflection DAC 53 until pattern drawing in one minor area, i.e., one sub-field, by minor deflection DAC 54 is completed, or until the major deflection position is reset Table position data is applied to circuit 55 for table movement correction from drawing data deflection control section 51. The outputs from major deflection DAC 53 and circuit 55 for table movement correction are added by adder circuit 56. Then, the output of adder 56 is applied to major deflector 25. The output of minor deflection DAC 54 is applied to minor deflector 26 for the purpose of sub-field pattern drawing.

The maximum tolerable movement data of table 12 from drawing data deflection control section 51, is set into moved distance counter 57. This maximum tolerable movement is the tolerable value of the distance of movement of table 12 during pattern drawing of one sub-field by minor deflector 26. It is the tolerable value below which the deflection distortion is at a tolerable level. Accordingly, it should be set in accordance with the dimensions of the pattern to be drawn, and the required pattern accuracy. When drawing is performed, the data of moved distance counter 57 and the output of circuit 55 for table movement correction are compared by comparator circuit 58. When the output of circuit 55 becomes as large as the data from counter 57, a coincident signal is sent, as a drawing stop signal, from comparator circuit 58 to drawing data deflection control section 51. When this coincident signal is received by control section 51, a new major deflection position and a minor deflection distortion correction coefficient data are calculated by computer 30. Each of these new data is reset into calculating circuit 52.

In this embodiment, the major deflector 25 is designed to minimize its deflection aberration. In fact, the distortion correction of 1.2 $\mu$m at the maximum is required for every 1 mm-width deflection by the major deflector 25. The distortion correction of 0.2 $\mu$m at the maximum is required for every 50 $\mu$m-width deflection by the minor deflector 26. For drawing a VLSI pattern in the order of submicrons, the calculation for the beam position correction is executed for every 0.01 μm of the moved distance of the table 12. In this embodiment, the tolerable maximum value of the deflection distortion with respect to the displacement of the major deflection position due to the table movement is 0.04 μm. The moving distance of the table 12 which causes to generate the deflection distortion of 0.04 μm, while the minor deflection is performed in a desired sub-field, is different by the position of the beam 28 deflected by the major deflector 25. Therefore, a plurality of tolerable maximum value data obtained for a plurality of different major deflection positions is preset in a memory table provided in computer 30. In this case, the tolerable moving distance of the table 12 causing 0.04 μm deflection distortion is set between 30 μm to 120 μm. For example, if a pattern is drawn in a sub-field at the control portion of the wafer 11, the data representing the tolerable moving distance data read out from the memory table and preset in the counter 57 may be around 120 μm. On the contrary, if a pattern is drawn in a sub-field at the peripheral portion of the wafer 11, the tolerable moving distance may be around 30 μm.

The major deflection DAC 53 has an 18-bit construction and the setting time thereof is about 50 μsec. The minor deflection DAC 54 has a 12-bit construction and the setting time thereof is about 200 nsec. Therefore, the calculation for the major deflection correction and the minor deflection correction should be done within 50 μsec. and 200 nsec., respectively, so as to maintain the pattern drawing throughput at a high level.

Since the major deflection should be done over a large area, a large deflection distortion caused by the major deflection should be corrected by a higher order polynomial calculation which requires relatively long period of time. The minor deflection area is very small and the distortion correction of the minor deflection may be made by a lower order polynomial calculation which is performed within very short time. Thus, the pattern drawing sequence progresses in the order of:
(1) Major deflection correction calculation;
(2) Setting of major deflection DAC 53;
(3) Minor deflection correction calculation;
(4) Setting of minor deflection DAC 54.

Now, the major deflection distortion correction calculation and the minor deflection distortion correction calculation will be described by referring to FIGS. 3 and 4.

The coordinates (Sx, Sy) of a major deflection position, the coordinates (Tx, Ty) of a position of table 12 and the major deflection coordinates (Mx, My) are theoretically represented by the following equations:

$$\begin{cases} Mx = Sx - Tx \\ My = Sy - Ty \end{cases}$$

For correcting the major deflection distortion, voltages Dx, Dy to be applied to major deflector 25 are calculated by the following equations, $$\begin{cases} Dx = A0 + (1 + A1)Mx + A2My + A3Mx^2 + A4MxMy + \\ \quad A5My^2 + A6Mx^3 + A7Mx^2My + A8MxMy^2 + A9My^3 \\ Dy = B0 + (1 + B1)My + B2Mx + B3My^2 + B4MyMx + \\ \quad B5Mx^2 + B6My^3 + B7My^2Mx + B8MyMx^2 + B9Mx^3 \end{cases}$$

where A0 to A9 and B0 to B9 represent distortion correction coefficients for the major deflection, supplied from computer 30.

Figure 3:
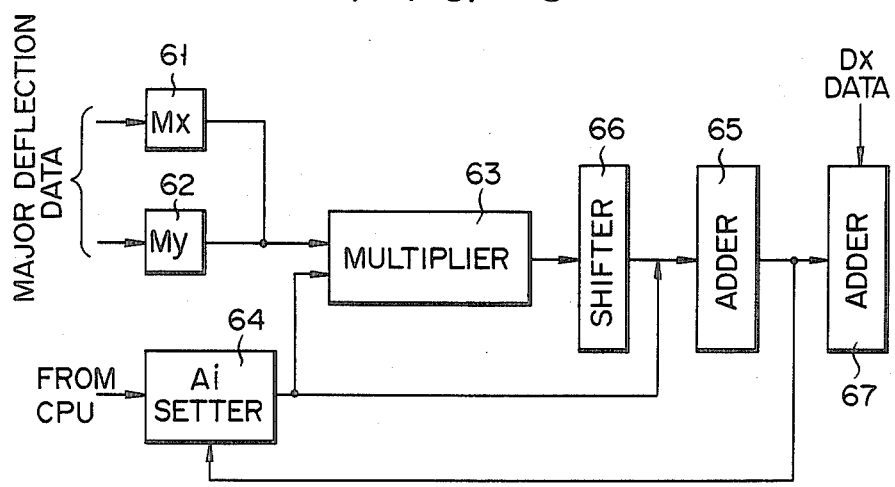
FIG. 3 is a block diagram of a major deflection distortion correction calculation circuit shown in FIG. 2.

The major deflection voltage Dx, in which distortions of the major deflection are corrected, is obtained from the circuit of FIG. 3, which realizes the equation described above. In FIG. 3, the major deflection data representing the major deflection coordinates (Mx, My) is supplied to buffer registers 61 and 62 from drawing data deflection control section 51. The data of the coordinates (Mx, My) is supplied to one input of a multiplier 63 which has the other input for receiving "Ai" data set in an "Ai" (i=0, ... 9) setter 64 from computer 30. The output of "Ai" setter 64 is also supplied to an input side of an adder 65. An output of multiplier 63 is supplied to adder 65 via a bit shifter 66. An output of adder 65 is supplied to adder 67 and fed back to Ai setter 64. The data Dx is obtained from adder 67.

The operation of the circuit of FIG. 3 for realizing the equation of Dx is self-explanatory and further explanation thereof is omitted here. The voltage Dy is also obtained in the similar manner.

Now, the distortion correction calculation of the minor deflection will be described. The coordinates data (mx, my) of the minor deflections are used to correct minor deflection distortion in the following equations for obtaining the minor deflection voltages dx and dy:

$$\begin{cases} dx = C0 + C1mx + C2my + C3mx \cdot my \\ dy = D0 + D1my + D2mx + D3my \cdot mx \end{cases}$$

where C0 to C3 and D0 to D3 represent distortion correction calculation coefficients for the minor deflection.

Figure 4:
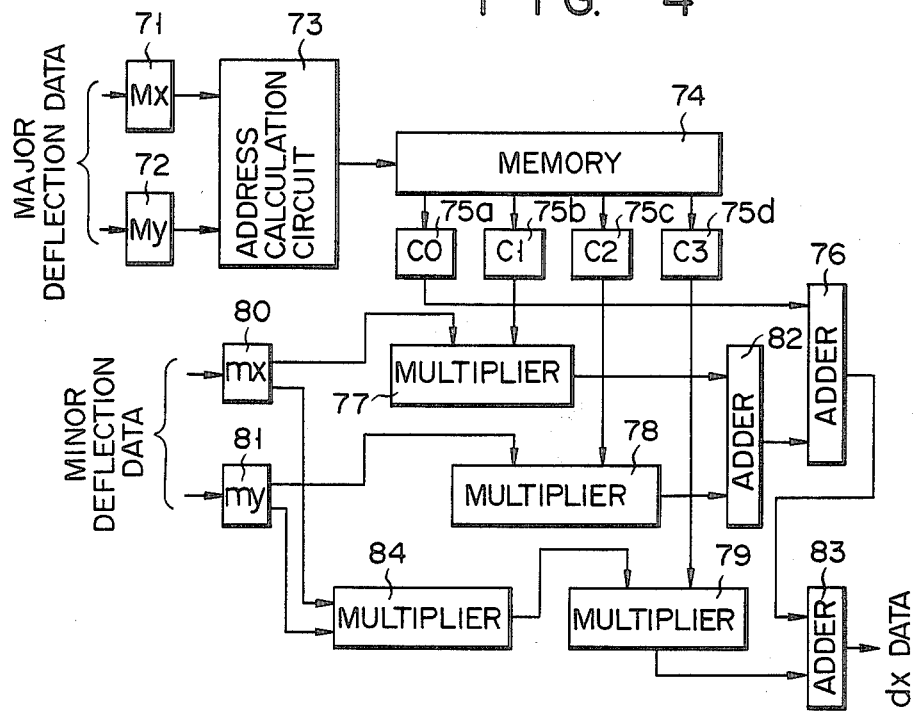
FIG. 4 is a block diagram of a minor deflection distortion correction calculation circuit shown in FIG. 2.

The voltage dx can be obtained from the circuit of FIG. 4. In the figure, the major deflection data representing the coordinates (Mx, My) is supplied to buffer circuits 71 and 72, respectively. The data is then supplied to an address calculation circuit 73 which delivers corresponding address data to a memory 74 for obtaining corresponding coefficients C0 to C3 for the distortion correction of the minor deflection. Coefficients C0 to C3, read out from memory 74, are latched in latches 75a, 75b, 75c, 75d and then supplied to adder 76 and multipliers 77, 78 and 79, respectively at one end thereof.

The minor deflection data representing the coordinates (mx, my) is supplied to buffer circuits 80 and 81, respectively. Outputs of latch 75b and buffer circuit 80 are multiplied at multiplier 77 and the output thereof is supplied to one input of an adder 82. Coefficient output C2 from buffer 75c is supplied to multiplier 78 together with an output of buffer 81 to deliver an output to adder 82 at its other end. An output of adder 76 is supplied to one input of an adder 83. Data stored at buffers 80 and 81 is also supplied to multiplier 84, whose output is then supplied to the other input of multiplier 79. An output of multiplier 79 is supplied to the other input of adder 83. The output of adder 83 is data representing the desired voltage dx for the minor deflector 26. The voltage dy can be obtained in the similar circuit in which the coefficients D0 to D3 are obtained from a memory corresponding to memory 74 of FIG. 4.

The operation of the circuit of FIG. 4 for realizing the equation of dx is self-explanatory, and further explanation thereof can be omitted here. The voltage dy is also obtained in the similar manner.

The method based on the two-step deflection, major and minor, and using major deflection high speed DAC 53 to cover the major deflection area (the entire wafer chip area), and minor deflection DAC 54 to cover the minor deflection area, as in this embodiment, may be found in E. V. Weber and R. D. Moore, J. Vac. Science and Technology, vol. 16, page 1780 (1979). It is realized by Electronic Beam Drawing Device EL-2 (trade name).

The electron beam drawing method using the drawing device thus constructed will be described.

Figure 5:
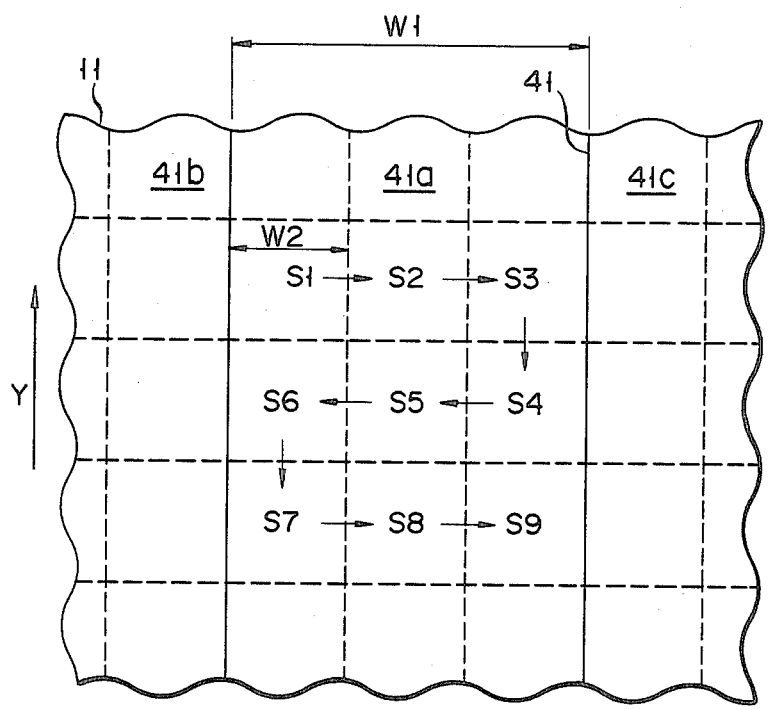
FIG. 5 shows a view useful in explaining the drawing areas of a wafer.

FIG. 5 illustrates a part of a drawing area or field on wafer 11. The drawing field is segmented into a plurality of frames or fields 41a, 41b, 41c,... and so on, which are determined by deflection width W1 of major deflector 25. Field 41a is segmented into a plurality of small areas or sub-fields S1, S2, ... S9, which are determined by deflection width W2 of minor deflector 26. Drawing is performed in each of these sub-fields. For example, beam 28 is positioned at the center position of sub-field S1 by major deflector 25. Then, a desired pattern is drawn in sub-field S1 by the beam 28, deflected by minor deflector 26. During the drawing, table 12 is continuously moved at a constant speed in the Y-direction. When drawing in sub-field S1 is ended, the beam 28, deflected by major deflector 25, is positioned, for example, to the center position of next sub-field S2. Pattern drawing in sub-field S2 is started. Similar pattern drawing is subsequently applied to sub-fields S3 to S9, in this order.

Drawing in a sub-field is performed by controlling the beam deflection position within the range of deflection width W2 by minor deflector 26. During drawing, the deflection position, which is shifted due to the movement of table 12, is corrected by a specific amount as determined by a moving speed of the table. The correction is applied to main deflector 25 from DAC 55. If the time required for drawing in one sub-field is equal to the set value, minor deflector 26 can draw the pattern as if table 12 apparently stops. However, if the pattern density in one sub-field is especially great, much more time is needed for the drawing. Before pattern drawing is ended, the amount of table movement is great, possibly causing deflection distortion. It is an object of this present invention to solve this problem, which will be described later.

Figure 6:
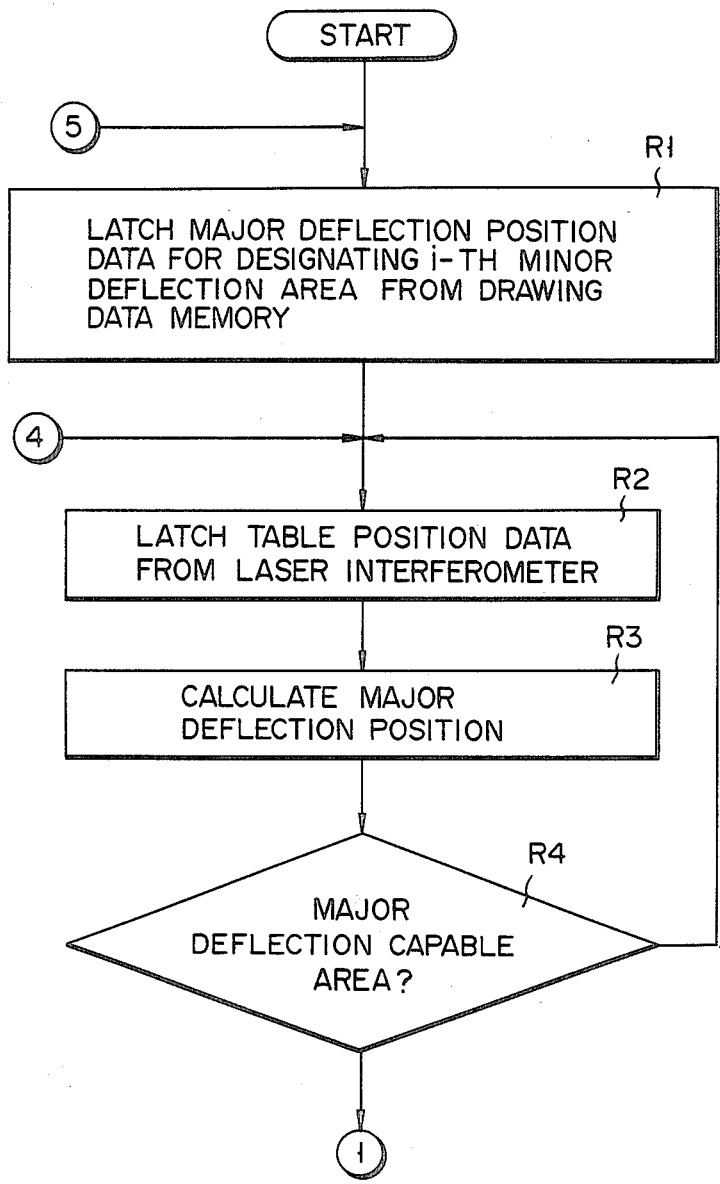
FIG. 6, FIG. 7 and FIG. 8 show, in combination, a flow chart for explaining the operation of the embodiment of FIGS. 1 and 2.
Figure 7:
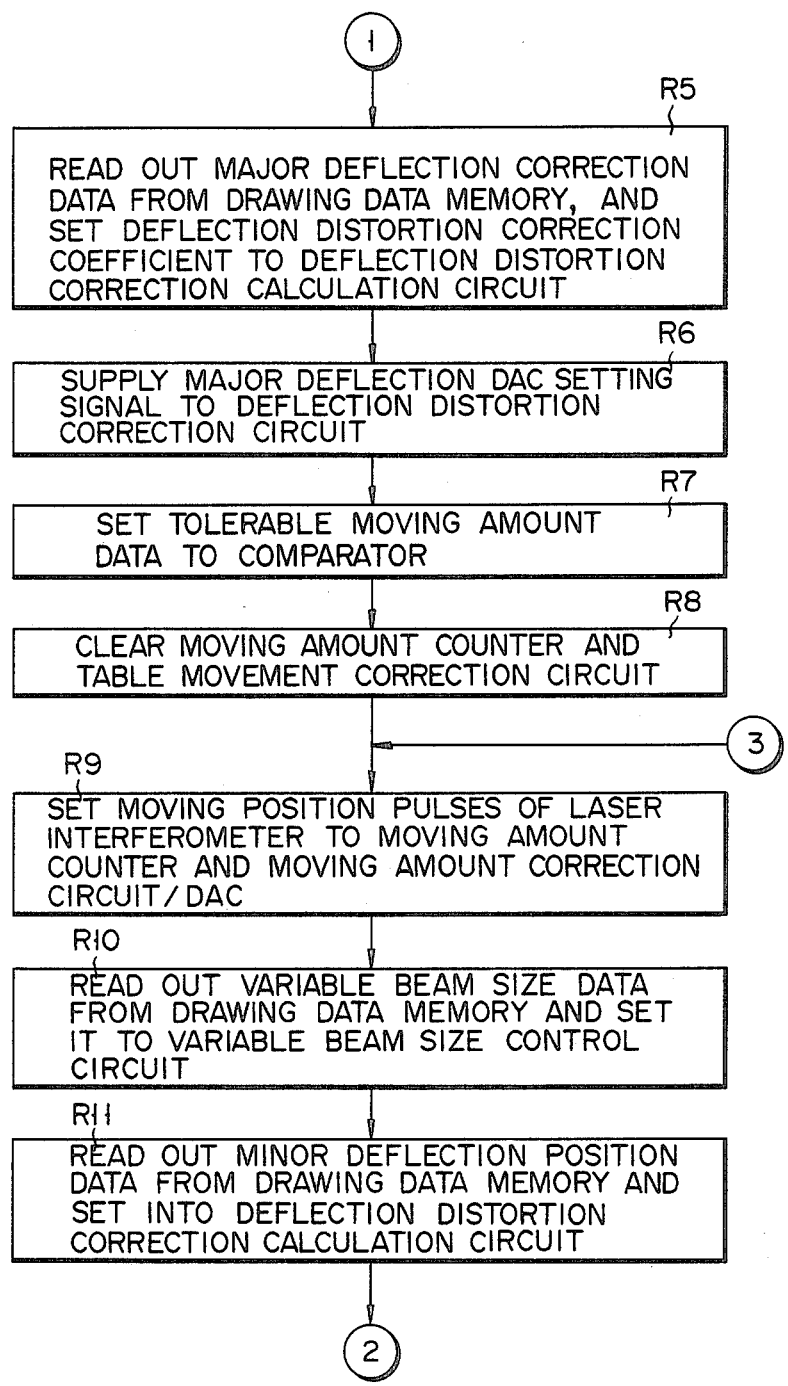
Figure 8:
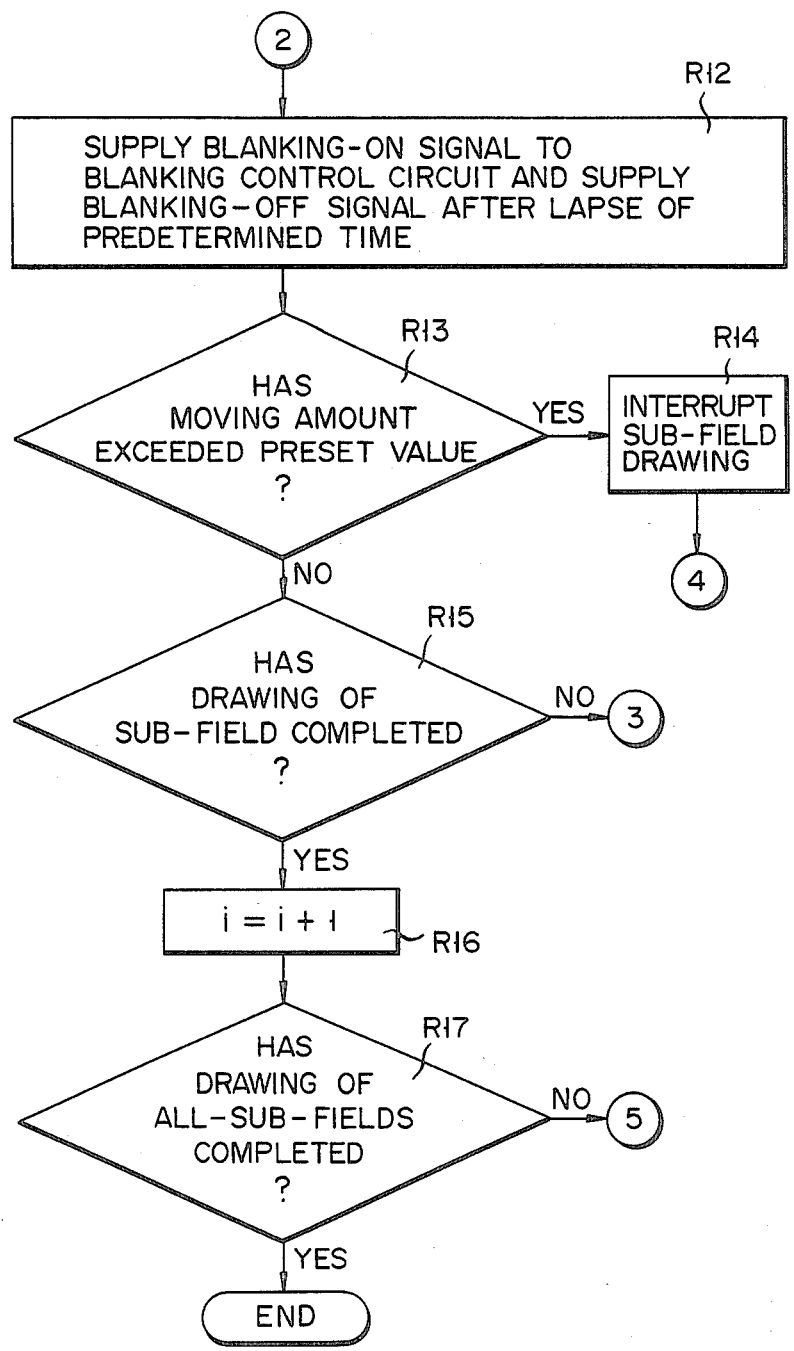

How to draw a pattern will be described with reference to the flowchart of FIGS. 6 to 8.

First, the constant movement of table 12, with wafer 11 placed thereon, is started. The current position of table 12 is measured by laser interferometer 32. In the step R1, the major deflection position data for designating i-th minor deflection area or sub-field is read out from drawing data memory 50 and the read data is latched in the drawing data deflection control section 51. In the next step R2, the table position data is obtained from laser interferometer 32 and is latched in section 51. The routine goes to step R3, where a major deflection position is calculated. In the next step R4, it is checked whether the calculated major deflection position is a major deflection capable area. If NO is obtained, the routine goes back to step R2, and the same routine is repeated. If YES is obtained, the next step R5 is executed. In this step R5, the major deflection correction data is read out from drawing data memory 50 and the deflection distortion correction coefficient data is obtained based on the read correction position data. The coefficient data is set to deflection distortion correction calculation circuit 52. Then, in step R6, the major deflection DAC setting signal is supplied to deflection distortion correction circuit 52 from control section 51.

In the next step R7, the tolerable moving amount data is read from the memory table and set to comparator 58. At this time, moving amount counter 57 is zero-cleared and table movement correction circuit/DAC 55 is also cleared in the next step R8. The routine goes to next step R9, where moving position pulses generated from laser interferometer 32 are set in moving amount counter 57 and table movement correction circuit/DAC 55, simultaneously. In the next step R10, variable beam size data is read out from drawing data memory 50 and this data is set to variable beam size control circuit 35.

Now, in step R11, the minor deflection position data is read out from drawing data memory 50 and the read data is set into deflection distortion correction calculation circuit 52. The routine goes to the next step R12, where a blanking-ON signal is supplied to blanking control circuit 34 and a blanking-OFF signal is supplied thereto after a lapse of predetermined time.

In step R13, it is checked whether the table movement distance during pattern drawing in step 12 becomes greater than the value present in counter 57. If YES is obtained in the step R13, the routine goes to next step R14, where the sub-field drawing is interrupted. Then the step returns to the previous step R2 and the similar operation is repeated.

If NO is obtained in step R13, the routine goes to step R15, where a check is done as to whether the pattern drawing of the specified sub-field is completed. If NO is obtained at the step R15, the routine returns to the earlier step R9, and the similar operation is repeated.

If YES is obtained at the step R15, the next subfield is designated by major deflection data in step R16. In the newly-designated sub-field, the similar pattern drawing routine is repeated in the same way. Thus, whether the drawing of all sub-fields has been completed is checked in step R17. If NO is obtained in step R17, the operation goes back to the initial step R1 and the similar operation will be repeated until all sub-fields are drawn. If this is the case, the routine goes to the end.

It should be understood that this invention is not limited to the above-mentioned embodiment alone. For example, a field may be appropriately segmented into sub-fields in a manner different from that shown in FIG. 5. It is evident that the order of drawing is not limited to that shown in FIG. 5.

What is claimed is:

1. A charged beam drawing method for drawing a desired pattern on a specimen placed on a continuously moving table by using a major deflector with a large beam deflection width and a minor deflector with a small beam deflection width, said charged beam drawing method comprising the steps of:

segmenting an area to be drawn into small areas within which the charged beam is deflectable;

setting a major deflection position, as given by said major deflector for a small area;

setting the correction data for minor deflection distortion, in connection with said major deflection position;

drawing a pattern within said small area while correcting a minor deflection distortion on the basis of said correction data;

feeding back to said major deflector the position data of said table when patterns are successively drawn in said small area, thereby to correct an incorrect displacement of the drawing position due to the movement of said table;

interrupting said small area drawing by the minor deflector when said table moves from the position of said table when said small area drawing starts by a distance longer than a predetermined distance;

resetting said major deflection position at a position allowing the drawing of the remaining patterns in said small area;

resetting the minor deflection correction data in connection with the major deflection position after said major deflection position resetting; and drawing the remaining patterns in said small area.

2. The charged beam drawing method according to claim 1, in which the drawing position displacement due to the movement of said table is corrected by adding together said set major deflection position and a displacement of said table from the position when said small area drawing starts.

3. The charged beam drawing method according to claim 1, in which said minor deflection distortion correction data is set by calculating a deflection distortion coefficient which is used for obtaining the deflection data whose deflection distortion from said major deflection position is corrected, by using the pattern data to be drawn.

4. A charged beam drawing apparatus having a major deflector with a large deflection width and a minor deflector for drawing a pattern in a small area, said charged beam drawing apparatus comprising:

a table, on which a specimen to be irradiated by generated charged beam is placed;

means for moving said table;

means for detecting a movement of said table;

means for correcting a deviation of the major deflection beam position caused by the movement of the table;

means for setting a tolerable movement of said table during the small area drawing;

means for drawing a predetermined pattern by using the charged beam;

means for interrupting the drawing when the table movement exceeds a set value;

means for resetting the major deflection position to a position allowing the drawing of the remaining pattern;

means for resetting correction data for the minor deflection distortion in connection with said reset position; and means for drawing the remaining patterns after these settings are done.

5. A charged beam drawing apparatus according to claim 4, wherein said beam position deviation correction means includes means for adding the initially-set major deflection position and the movement of the table as measured from the start of the small area drawing, and means for applying the output of the adder to the major deflector.

6. A charged beam drawing apparatus according to claim 4, wherein minor deflection distortion data resetting means includes means for calculating a deflection distortion correction coefficient which is used for obtaining the correction data for minor deflection distortion on the basis of pattern data.

* * * * *